(12) United States Patent
Moriuchi et al.

(10) Patent No.: US 11,985,795 B2
(45) Date of Patent: May 14, 2024

(54) TEMPERATURE CONTROL UNIT

(71) Applicant: TOMOEGAWA CORPORATION, Tokyo (JP)

(72) Inventors: Hideki Moriuchi, Shizuoka (JP); Shuhei Hatano, Shizuoka (JP)

(73) Assignee: TOMOEGAWA CORPORATION, Tokyo (JP)

( * ) Notice: Subject to any disclaimer, the term of this patent is extended or adjusted under 35 U.S.C. 154(b) by 199 days.

(21) Appl. No.: 17/595,069

(22) PCT Filed: May 14, 2020

(86) PCT No.: PCT/JP2020/019303
§ 371 (c)(1),
(2) Date: Nov. 8, 2021

(87) PCT Pub. No.: WO2020/235449
PCT Pub. Date: Nov. 26, 2020

(65) Prior Publication Data
US 2022/0201895 A1 Jun. 23, 2022

(30) Foreign Application Priority Data
May 21, 2019 (JP) .................. 2019-094915

(51) Int. Cl.
*H05K 7/20* (2006.01)
(52) U.S. Cl.
CPC ..... *H05K 7/20272* (2013.01); *H05K 7/20254* (2013.01); *H05K 7/20472* (2013.01)
(58) Field of Classification Search
CPC ........... H05K 7/20272; H05K 7/20254; H05K 7/20472
See application file for complete search history.

(56) References Cited

U.S. PATENT DOCUMENTS 6,360,814 B1 3/2002 Tanaka et al.
9,009,971 B2 * 4/2015 Campbell .............. H05K 7/203
361/689

(Continued)

FOREIGN PATENT DOCUMENTS

JP H04112005 A 4/1992
JP H05322464 A 12/1993

(Continued)

OTHER PUBLICATIONS

Extended European Search Report for European Application No. 20808697.5 dated Apr. 21, 2023.

(Continued)

*Primary Examiner* — Adrian S Wilson
(74) *Attorney, Agent, or Firm* — Pearne & Gordon LLP

(57) ABSTRACT

With an objective of obtaining a temperature control unit capable of highly uniform temperature control, provided is a temperature control unit (1) having a heat transfer medium introduction port (2) configured to introduce a heat transfer medium from outside, a temperature control mechanism (3) through which the heat transfer medium from the heat transfer medium introduction port (2) passes, and a heat transfer medium discharge port (4) configured to discharge the heat transfer medium from the temperature control mechanism (3) to outside, wherein: the temperature control mechanism (3) is provided with a porous metal body and a housing (5) configured to house the porous metal body; at least one main surface of the housing (5) is exposed to an outer side of the temperature control mechanism (3), and an inner side of the main surface contacts the porous metal body, thereby exchanging heat between the porous metal body and outside; and a heat transfer medium dispersion area (10) is provided between the heat transfer medium introduction port (2) and the porous metal body.

9 Claims, 11 Drawing Sheets

(56) References Cited

U.S. PATENT DOCUMENTS

| | | | |
|---|---|---|---|
| 9,095,942 B2 * | 8/2015 | Campbell | H05K 7/203 |
| 10,739,830 B2 * | 8/2020 | Lee | G11B 33/1406 |
| 10,838,287 B2 * | 11/2020 | Shimizu | F28D 15/046 |
| 11,150,030 B2 * | 10/2021 | Kishimoto | F28D 15/02 |
| 11,337,336 B2 * | 5/2022 | Aoki | H05K 7/20327 |
| 11,343,945 B2 * | 5/2022 | Dogruoz | H05K 1/0209 |
| 11,346,617 B2 * | 5/2022 | Kaibuchi | F28D 15/046 |
| 11,419,246 B2 * | 8/2022 | Farshchian | F28D 15/0275 |
| 2006/0196640 A1 | 9/2006 | Siu | |
| 2010/0018678 A1 | 1/2010 | Siu | |
| 2010/0296247 A1 | 11/2010 | Chang et al. | |
| 2023/0194193 A1 * | 6/2023 | Moriuchi | F28F 13/003 165/109.1 |
| 2023/0200006 A1 * | 6/2023 | Moriuchi | H01L 23/473 165/80.4 |
| 2023/0282495 A1 * | 9/2023 | Hatano | H01L 21/67103 165/185 |

FOREIGN PATENT DOCUMENTS

| | | | | |
|---|---|---|---|---|
| JP | 2001077257 | A | 3/2001 | |
| JP | 2003287379 | A | 10/2003 | |
| JP | 2003314990 | A | 11/2003 | |
| JP | 2005123496 | A | 5/2005 | |
| JP | 2008522129 | A | 6/2008 | |
| JP | 2009041891 | A | 2/2009 | |
| JP | 2010272870 | A | 12/2010 | |
| JP | 3169381 | U | 7/2011 | |
| JP | 2015112866 | A | 6/2015 | |
| JP | 2017044461 | A | 3/2017 | |
| JP | WO 2017/038380 | * | 3/2017 | F28D 1/04 |
| JP | 2019009433 | A | 1/2019 | |
| KR | 200456335 | Y1 | 10/2011 | |

OTHER PUBLICATIONS

International Search Report for International Application No. PCT/JP2020/019303 dated Aug. 18, 2020 with English translation.

* cited by examiner (A)

(B)

TEMPERATURE CONTROL UNIT

TECHNICAL FIELD

The present invention relates to a temperature control unit.

BACKGROUND

Generally, when the power used in an electrical device increases, the amount of heat that is generated increases and the temperature of the electrical device becomes high, causing malfunctions, breakdowns, and the like. Therefore, electrical devices are often provided with cooling members for cooling and radiating away the generated heat.

As one example of conventional art relating to such cooling members, Patent Document 1 discloses a cooling member that has excellent cooling effects, that can easily be made compact and thin, and that allows localized cooling. The cooling member has a metal fiber sheet comprising metal fibers, and a cooling mechanism configured to cool the metal fiber sheet, wherein the cooling mechanism is provided with a housing configured to house the metal fiber sheet and a refrigerant-introducing means configured to introduce a refrigerant into the housing.

CITATION LIST

Patent Literature

Patent Document 1: JP 2019-9433 A

SUMMARY OF INVENTION

Technical Problem

However, in Patent Document 1, which is an example of the above-mentioned conventional art, there is a possibility that uneven cooling will occur in the case in which the dispersiveness of the refrigerant in the housing is low. Additionally, the same can be said for the case in which the temperature in the housing is to be raised. There is a possibility that uneven heating will occur in the case in which the dispersiveness of a heating medium in the housing is low. That is, if the dispersiveness of a heat transfer medium in a housing is low, then there is a possibility that the temperature control will be uneven, and if the temperature control becomes uneven, then it is difficult to achieve uniform temperature control.

The present invention was developed in consideration of the above, and an objective of the invention is to obtain a temperature control unit capable of highly uniform temperature control.

Solution to Problem

The present invention, which solves the above-mentioned problem and achieves the objective, is a temperature control unit comprising: a heat transfer medium introduction port configured to introduce a heat transfer medium from outside; a temperature control mechanism through which the heat transfer medium from the heat transfer medium introduction port passes; and a heat transfer medium discharge port configured to discharge the heat transfer medium from the temperature control mechanism to outside, wherein: the temperature control mechanism comprises a porous metal body; and a housing configured to house the porous metal body; at least one main surface of the housing is exposed to an outer side of the temperature control mechanism, and an inner side of the main surface contacts the porous metal body, thereby exchanging heat between the porous metal body and outside; and a heat transfer medium dispersion area is provided between the heat transfer medium introduction port and the porous metal body.

In the temperature control unit of the present invention having the above-mentioned configuration, a heat transfer medium buffer area is preferably provided between the porous metal body and the heat transfer medium discharge port.

In the temperature control unit of the present invention having the above-mentioned configuration, the porous metal body is preferably a metal fiber sheet configured to include metal fibers.

In the temperature control unit of the present invention having the above-mentioned configuration, the heat transfer medium dispersion area preferably has a shape that is continuously angled so as to widen out from the heat transfer medium introduction port towards both end portions of a heat transfer medium introduction surface of the porous metal body; and the heat transfer medium buffer area preferably has a shape that is continuously angled so as to narrow down from both end portions of a heat transfer medium discharge surface of the metal fiber sheet towards the heat transfer medium discharge port.

In the temperature control unit of the present invention having the above-mentioned configuration, the metal fiber sheet preferably comprises: a first metal fiber sheet arranged on the heat transfer medium introduction port side; and a second metal fiber sheet arranged on the heat transfer medium discharge port side, and a gap is formed between the first metal fiber sheet and the second metal fiber sheet.

In the temperature control unit of the present invention having the above-mentioned configuration, the metal fiber sheet preferably has a shape such that a passage for the heat transfer medium becomes longer in a portion at which the flow rate of the heat transfer medium becomes higher.

In the temperature control unit of the present invention having the above-mentioned configuration, the metal fiber sheet is preferably configured such that the metal fibers are densely arranged in a portion at which the flow rate of the heat transfer medium becomes higher.

In the temperature control unit of the present invention having the above-mentioned configuration, part of the metal fiber sheet is preferably removed to form a flow passage with a meandering shape.

In the temperature control unit of the present invention having the above-mentioned configuration, the housing is preferably configured such that a flow passage for the heat transfer medium becomes narrow in a portion at which the flow rate of the heat transfer medium becomes lower.

In the temperature control unit of the present invention having the above-mentioned configuration, the housing is preferably configured such that a structure blocks part of a flow passage for the heat transfer medium, thereby forming a meandering flow passage.

Effects of Invention

According to the present invention, a temperature control unit capable of highly uniform temperature control can be obtained.

DESCRIPTION OF EMBODIMENTS

Figure 1:
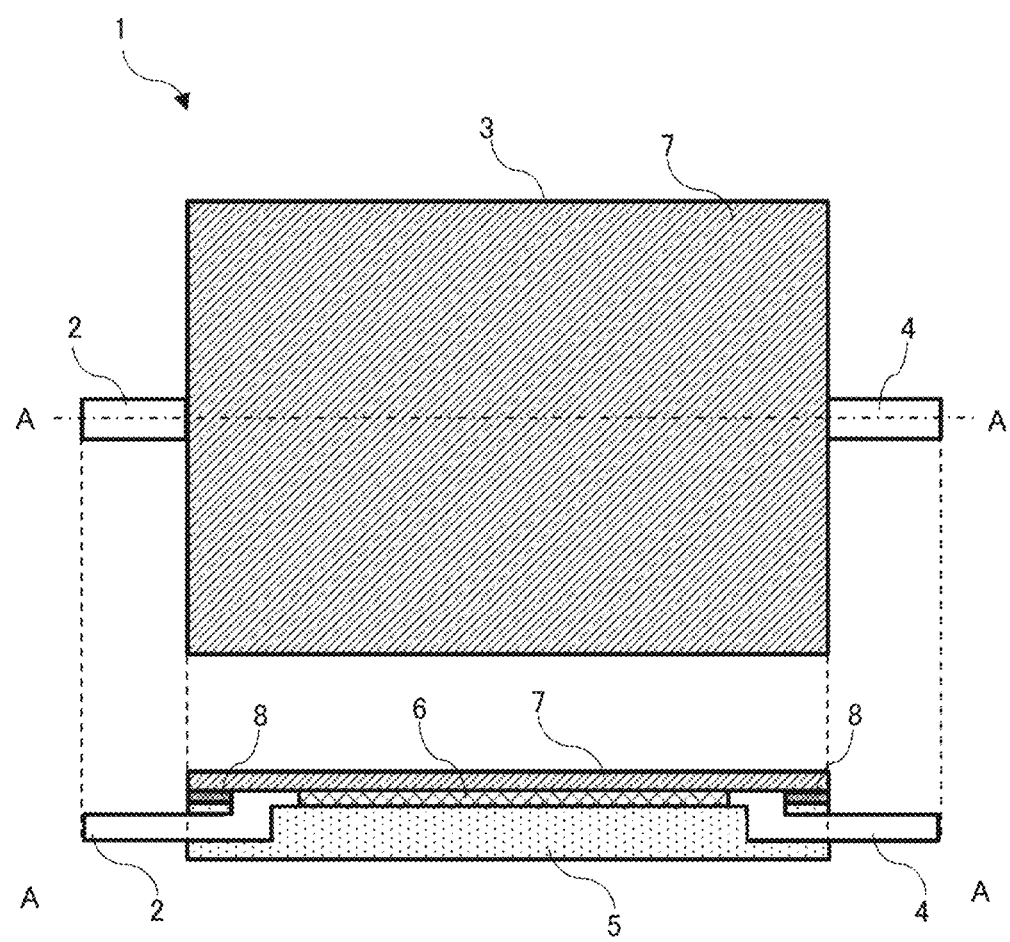
FIG. 1 is a diagram showing a top view of a temperature control unit according to Embodiment 1 and a section view along A-A in the top view.

Embodiments of the present invention will be described below with reference to the drawings. However, the present invention should not be construed in a limiting manner based on the descriptions of the embodiments below. In the descriptions below, features that are the same will be denoted by the same reference numbers.

First, the terminology to be used in the description below will be defined.

"Metal fibers" refers to fibers in which the main component is a metal. For example, "copper fibers" refers to fibers in which the main component is copper.

Additionally, in the case in which the main component is a metal, a certain amount of components other than said metal, such as impurities that are unavoidably contained, may be included, as long as the effects of the present invention are not compromised.

Additionally, "thermal conductivity (W/(m·K))" is a value as measured by the laser flash method (for example, by using a "TC7000 series" laser flash thermal constant measuring device manufactured by Ulvac Riko, Inc.)

Additionally, "average fiber diameter" refers to the arithmetic mean of area-based diameters derived by computing the cross-sectional areas perpendicular to the lengthwise direction of the metal fibers based on the perpendicular cross-sections at multiple locations in a metal fiber sheet imaged by a microscope, and computing the diameters of perfect circles having the same areas as said cross-sectional areas.

The multiple locations may, for example, be twenty locations.

Additionally, "average fiber length" refers to the arithmetic mean of measured values of the lengths of fibers in the lengthwise direction for multiple fibers randomly selected in a microscope image.

If the fibers are not straight, then the lengths are the lengths of curves along the fibers.

The multiple fibers may, for example, be twenty fibers.

Additionally, "fill rate" refers to the proportion of the volume of a fiber sheet occupied by the fiber portions, and is computed from the basis weight and thickness of the fiber sheet, and the true density of the fibers, by means of the equation below.

If the fiber sheet includes multiple types of fibers, then the fill rate can be computed by employing a true density value reflecting the compositional ratio of the fibers.

(Fill rate (%))=(basis weight of fiber sheet)/((thickness of fiber sheet)×(true density))×100

"Thickness of the sheet" refers, for example, to the arithmetic mean in the case in which the metal fiber sheet has been measured at measurement points by means of an air-based terminal drop-type film thickness gauge (for example, "Digimatic Indicator ID-C112X" manufactured by Mitutoyo Corp.).

"Homogeneity" refers to a sheet comprising fibers having little variance, within the sheet, in the properties of the sheet, such as electrical properties, physical properties, and air permeability properties.

As an indicator of homogeneity, it is possible to employ, for example, the coefficient of variation (CV value) of the basis weight, as defined by the JIS Z8101 standard, per square centimeter.

"Void rate" refers to the proportion of the volume of a fiber sheet constituted by portions in which voids are present, and is computed from the basis weight and thickness of the fiber sheet, and the true density of the fibers, by means of the equation below.

If the fiber sheet includes multiple types of fibers, then the void rate can be computed by employing a true density value reflecting the compositional ratio of the fibers.

(Void rate (%))=(1−(basis weight of fiber sheet)/((thickness of fiber sheet)×(true density)))×100

The heat transfer medium in the present invention may be a gas, or may be a liquid or the like, and the characteristics thereof are not limited.

That is, the heat transfer medium in the present invention may be a gas such as air, may be a liquid such as water or alcohol, or may be a fluorine-based compound such as a hydrofluorocarbon or a hydrofluoroether, or the like.

Embodiment 1

FIG. 1 is a diagram showing a top view of a temperature control unit 1 according to the present embodiment and a section view along A-A in the top view.

The temperature control unit 1 shown in FIG. 1 has a heat transfer medium introduction port 2, a temperature control mechanism 3, and a heat transfer medium discharge port 4.

The heat transfer medium introduction port 2 is a port through which the heat transfer medium is introduced into the temperature control mechanism 3 from outside.

The heat transfer medium discharge port 4 is a port through which the heat transfer medium in the temperature control mechanism 3 is discharged to outside.

A static mixer is preferably provided in the heat transfer medium introduction port 2 in order to disperse the heat transfer medium that is introduced. When a static mixer is provided in the heat transfer medium introduction port 2, turbulence is created in the heat transfer medium that is introduced, allowing the amount of heat transferred to be increased.

The temperature control mechanism 3 is provided with: a metal fiber sheet 6 configured to include metal fibers; a housing 5 configured to house the metal fiber sheet 6; a heat exchange plate 7 provided so that one main surface is exposed to the outer side of the temperature control mechanism 3 and the rear surface of the one main surface contacts the metal fiber sheet 6, thereby exchanging heat between the metal fiber sheet 6 and outside; and a sealing member 8 configured to seal between the housing 5 and the heat exchange plate 7.

The heat transfer medium introduced through the heat transfer medium introduction port 2 passes through the temperature control mechanism 3 and is discharged through the heat transfer medium discharge port 4.

The metal fiber sheet 6 may be composed solely of metal fibers or may be configured to include components other than metal fibers. Examples of the metal component in the metal fibers include copper, stainless steel, iron, aluminum, nickel, chromium, precious metals, and the like. Among the above, copper, stainless steel, and aluminum are preferable, and copper is particularly preferable. This is because copper fibers have an excellent balance of rigidity and plastic deformability. Examples of precious metals include gold, platinum, silver, palladium, rhodium, iridium, ruthenium, and osmium. Additionally, examples of components other than metal fibers that can be included in the metal fiber sheet 6 include polyethylene terephthalate (PET), polyvinyl alcohol (PVA), polyolefins, polyvinyl chloride (PVC), polyamides, and acrylic, as well as organic substances that provide the fibrous matter with bonding properties and carrier properties. In particular, in the case in which the metal fiber sheet 6 is a nonwoven fabric having multiple metal fibers that are randomly entangled, the form sustainability and the functionality at the time of production of the metal fiber sheet 6 can be aided or improved by including one or more of these organic substances.

In the metal fiber sheet 6, multiple metal fibers that are adjacent to each other are preferably bonded together. That is, in the metal fiber sheet 6, multiple metal fibers are preferably physically fixed to form bonded portions between the multiple metal fibers. In the metal fiber sheet 6, the multiple metal fibers may be directly fixed or indirectly fixed at the bonded portions. However, gaps should preferably be formed between at least some of the multiple metal fibers constituting the metal fiber sheet 6. This is because, when such gaps are formed in the metal fiber sheet 6, the heat transfer medium mentioned below can be more easily introduced into the metal fiber sheet 6. Additionally, at these bonded portions, the multiple metal fibers are preferably sintered because this stabilizes the thermal conductivity and homogeneity of the metal fiber sheet 6. The gaps formed between the multiple metal fibers may be formed by entanglement of the metal fibers. The void rate in the metal fiber sheet 6 is preferably at least 5% and at most 99%, more preferably at least 10% and at most 98%. Additionally, the thermal conductivity of the metal fiber sheet is preferably at least 5 W/(m·K).

Additionally, the metal fiber sheet 6 need only be a sheet-shaped structure, and may be a nonwoven fabric having multiple metal fibers that are randomly entangled, or may be a woven fabric or a mesh material having regularity. Additionally, the surface of the metal fiber sheet 6 may be flat, or may be made bumpy by performing a corrugation process.

The basis weight of the metal fiber sheet 6 should preferably be at least 10 g/m² and at most 1,000 g/m². By setting the basis weight of the metal fiber sheet 6 to be at least 10 g/m², cooling or heating effects can be increased, and by setting the basis weight of the metal fiber sheet 6 to be at most 1,000 g/m², the metal fiber sheet 6 can be made light in weight.

If the average fiber diameter of the metal fibers in the metal fiber sheet 6 is less than 1 μm, then the rigidity of the metal fibers becomes lower and clumps tend to form when producing the metal fiber sheet 6, causing the thermal conductivity and homogeneity of the metal fiber sheet 6 to become unstable. However, if the average fiber diameter of the metal fibers in the metal fiber sheet 6 exceeds 30 μm, then the rigidity of the metal fibers becomes excessively high and the metal fibers cannot easily become entangled. For this reason, the average fiber diameter of the metal fibers in the metal fiber sheet 6 should preferably be at least 1 μm and at most 30 μm, and particularly preferably at least 2 μm and at most 20 μm. Additionally, if the metal fiber sheet 6 is a nonwoven fabric in which multiple metal fibers are randomly entangled, then the average fiber length of the metal fibers in the metal fiber sheet 6 should preferably be at least 1 mm and at most 10 mm in order to stabilize the thermal conductivity and homogeneity of the metal fiber sheet 6.

Additionally, if the aspect ratio of the metal fibers in the metal fiber sheet 6 is lower than 33, then the metal fibers cannot easily become entangled. On the other hand, if the aspect ratio of the metal fibers in the metal fiber sheet 6 is higher than 10,000, then the homogeneity of the metal fiber sheet 6 decreases. For this reason, the aspect ratio of the metal fibers should preferably be at least 33 and at most 10,000.

Additionally, if the fill rate of the metal fiber sheet 6 is less than 2%, then pressure loss when introducing the heat transfer medium is suppressed, but the cooling effects or heating effects are lowered because the fiber amount becomes insufficient. On the other hand, if the fill rate of the metal fiber sheet 6 exceeds 65%, then pressure loss when introducing the heat transfer medium increases. For this reason, the fill rate of the metal fiber sheet 6 is preferably at least 2%, more preferably at least 4%, and particularly preferably at least 5%. Additionally, the fill rate is preferably at most 65%, and more preferably at most 60%.

Additionally, in order to increase the homogeneity of the metal fiber sheet 6, the CV value, which is the basis weight variation coefficient, as defined by the JIS Z8101 standard, per square centimeter of the metal fiber sheet 6, should preferably be at most 10%.

The method for manufacturing the metal fiber sheet 6 is not limited to a specific method. The manufacturing method in the case in which the metal fiber sheet 6 is a mesh material or a woven fabric may involve using a plain weave in which metal wires are crossed one wire at a time, or may involve using a twilled weave in which metal wires that are arranged vertically and metal wires that are arranged horizontally are crossed over each other two wires at a time. Alternatively, a Dutch weave, a plain Dutch weave, or a twilled Dutch weave may be used. Alternatively, in the case in which the metal fiber sheet 6 is a mesh material, metal wires may be welded in a crossed state without being woven. An example of a manufacturing method for the case in which the metal fiber sheet 6 is a nonwoven fabric is a method for forming sheets by means of a wet sheet-forming method. In a wet sheet-forming method, a slurry in which metal fibers and the like are dispersed in an aqueous medium is used to perform wet sheet-forming by means of a sheet-forming machine. In this case, the slurry may contain an additive such as a filler, a dispersant, a thickener, a defoamer, a sheet strength reinforcer, a sizer, a coagulant, a colorant, and a fixative. Additionally, a wet sheet obtained by the wet sheet-forming method may be subjected to a fiber entanglement treatment step for entangling the multiple metal fibers with each other. An example of the fiber entanglement treatment step is a method of spraying one main surface of the wet sheet with a high-pressure water jet. According to this method, the metal fibers or fibers including metal fibers can be entangled over the entirety of the wet sheet. This wet sheet is subjected to a dryer step by hot-air blow-drying after the fiber entanglement treatment step. This dryer step is preferably performed in an inert gas atmosphere using a reduced-pressure sintering furnace. The sheet that has been subjected to the dryer step is cooled to ambient temperature, then rolled up.

The sheet that is obtained after having undergone the fiber entanglement treatment step and the dryer step may be subjected to a pressing step before the multiple metal fibers are bonded. Due to the pressing step, excessively large voids existing between the multiple metal fibers can be reduced, thereby increasing the homogeneity. Additionally, by adjusting the pressure during the pressing step, the thickness of the metal fiber sheet 6 can also be adjusted.

As mentioned above, the bonded portions between the multiple metal fibers are preferably sintered by means of a sintering step. Due to the sintering step, the multiple metal fibers can be reliably bonded, the multiple metal fibers are fixed together, the CV value of the basis weight of the metal fiber sheet 6 is stabilized, and the homogeneity and the thermal conductivity of the metal fiber sheet 6 are stabilized.

Additionally, the metal fiber sheet 6 that has undergone the sintering step is preferably further subjected to a pressing step. By being further subjected to a pressing step after the sintering step, the homogeneity of the metal fiber sheet 6 can be further increased and the metal fiber sheet 6 can be made thin. Furthermore, due to the pressing step after the sintering step, the metal fibers move not only in the thickness direction, but also in the planar direction in the metal fiber sheet 6. As a result thereof, metal fibers are provided even in areas that were voids at the time of sintering, thereby improving the homogeneity of the metal fiber sheet 6, and this state is maintained by the plastic deformability of the metal fibers.

As the manufacturing method for the case in which the metal fiber sheet 6 is a nonwoven fabric, a dry method in which the sheet is compression molded may be used. In the dry method, a web mainly composed of metal fibers is prepared by a method such as the carding method or the air-laid method, and this web is compression molded. During the compression molding, the multiple metal fibers may be impregnated with a binder to bind the multiple metal fibers to each other. Examples of the binder include organic binders such as acrylic adhesives and inorganic binders such as colloidal silica.

The housing 5 is a thermally insulated structure configured to house the metal fiber sheet 6. Examples of the material of the housing 5 include metals, ceramics, and resins. Examples of metal materials include stainless steel, copper, and aluminum. Additionally, examples of ceramic materials include alumina, zirconia, barium titanate, silicon carbide, silicon nitride, and aluminum nitride. Additionally, examples of resin materials include polyacrylate resins, polyvinylpyrrolidone resins, polyester resins, polypropylene resins, fluororesins such as polytetrafluoroethylene, polyimide resins, polyamide resins, and polyparaphenylene benzobisoxazole resins. The housing 5 is thermally insulated with rock wool or the like after having been formed from the above-mentioned materials.

The heat exchange plate 7 is a member that includes a temperature-controlled surface on one main surface, such that the rear surface of this temperature-controlled surface contacts the metal fiber sheet 6, thus exchanging heat between this temperature-controlled surface and the metal fiber sheet 6. The material of the heat exchange plate 7 should preferably be a material with high thermal conductivity, and examples of materials with high thermal conductivity include stainless steel, copper, and aluminum. Additionally, the sintering step is preferably performed with the metal fiber sheet 6 on the heat exchange plate 7 in a state of contact therewith because this bonds the metal fiber sheet 6 with the heat exchange plate 7. When the metal fiber sheet 6 and the heat exchange plate 7 are bonded together, heat is more easily conducted between the metal fiber sheet 6 and the heat exchange plate 7. The sintering step is preferably performed in an inert gas atmosphere using a reduced-pressure sintering furnace.

The sealing member 8 is a member formed from a joining material configured to join the housing 5 to the heat exchange plate 7. As such a joining material, a metal joining material or an organic joining material may be used. Examples of metal joining materials include silver brazing material, phosphorus-copper brazing material, solder, and copper foil. The metal joining material preferably has a thermal conductivity of at least 50 W/(m·K) and a thickness of at most 100 μm. Examples of organic joining materials include epoxy, urethane, silicone, and the like, which should be heat-curable. Since organic joining materials have low thermal conductivities of less than 1 W/(m·K), they should preferably be made thin for the purposes of thermal conductivity, and the thickness thereof should preferably be at most 20 μm. The sealing material 8 is preferably used to join the heat exchange plate 7 to the housing 5 by means of sintering or a heat-curing reaction in a state in which the housing 5 is, for example, placed on a member obtained by bonding the metal fiber sheet 6 to the heat exchange plate 7.

Figure 2:
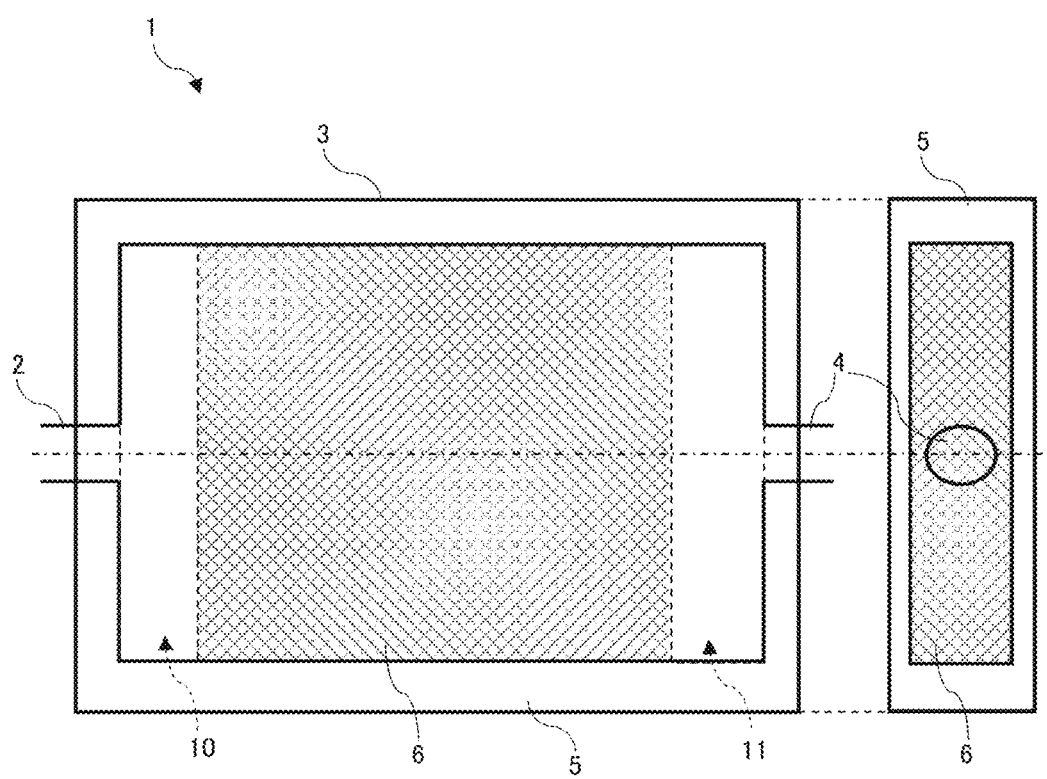
FIG. 2 is a diagram showing a horizontal section view of the temperature control unit according to Embodiment 1 and a side view from a side having a heat transfer medium discharge port.

FIG. 2 is a diagram showing a horizontal section view of the temperature control unit 1 according to the present embodiment and a side view from the side having the heat transfer medium discharge port 4. In FIG. 2, the heat transfer medium that has been introduced to the temperature control mechanism 3 through the heat transfer medium introduction port 2 is dispersed in the heat transfer medium dispersion area 10 before entering the metal fiber sheet 6, passes through the metal fiber sheet 6 and arrives at the heat transfer medium buffer area 11, and the heat transfer medium that has arrived at the heat transfer medium buffer area 11 is discharged to outside through the heat transfer medium discharge port 4.

As illustrated in FIG. 2, by providing the heat transfer medium dispersion area 10 between the heat transfer medium introduction port 2 and the metal fiber sheet 6 in the temperature control unit 1, the heat transfer medium that has been introduced through the heat transfer medium introduction port 2 can be dispersed before entering into the metal fiber sheet 6. Additionally, by providing the heat transfer medium buffer area 11 between the metal fiber sheet 6 and the heat transfer medium discharge port 4 in the temperature control unit 1, the heat transfer medium can be made to flow well. Therefore, by providing the heat transfer medium dispersion area 10 between the heat transfer medium introduction port 2 and the metal fiber sheet 6 inside the temperature control unit 1, and providing the heat transfer medium buffer area 11 between the metal fiber sheet 6 and the heat transfer medium discharge port 4 in the temperature control unit 1, the temperature-controlled surface can be prevented from being cooled or heated unevenly, thus allowing highly uniform temperature control.

As described above, according to the present embodiment, the temperature-controlled surface can be prevented from being cooled or heated unevenly.

Embodiment 2

In the present embodiment, a mode in which uneven cooling or heating on the temperature-controlled surface can be prevented by effectively dispersing the heat transfer medium by the shape of the housing, thus allowing highly uniform temperature control, will be described.

Figure 3:
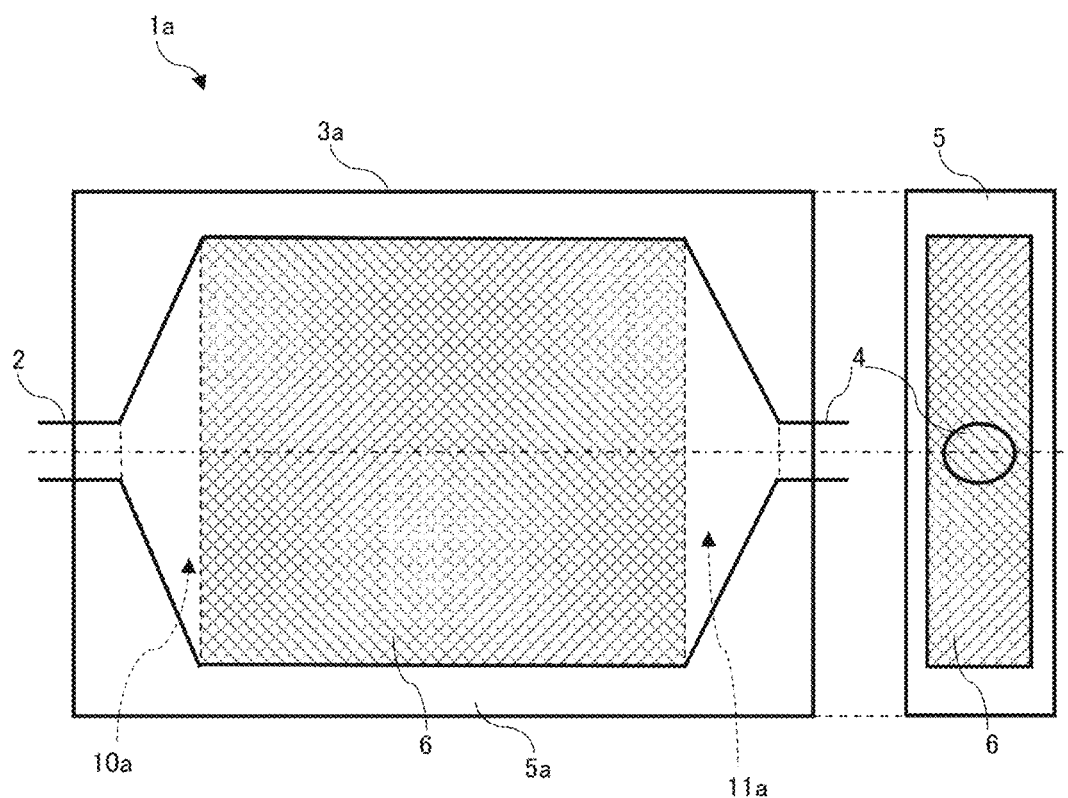
FIG. 3 is a diagram showing a horizontal section view of a temperature control unit according to Embodiment 2 and a side view from a side having a heat transfer medium discharge port.

FIG. 3 is a diagram showing a horizontal section view of the temperature control unit 1a according to the present embodiment and a side view from the side having the heat transfer medium discharge port 4. The temperature control unit 1a illustrated in FIG. 3 differs from the temperature control unit 1 illustrated in FIG. 2 in that a temperature control mechanism 3a is provided instead of the temperature control mechanism 3. The temperature control mechanism 3a differs from the temperature control mechanism 3 illustrated in FIG. 2 in being provided with a housing 5a instead of the housing 5, being provided with a heat transfer medium dispersion area 10a instead of the heat transfer medium dispersion area 10, and being provided with a heat transfer medium buffer area 11a instead of the heat transfer medium buffer area 11.

The housing 5a has a shape that continuously widens diagonally from the heat transfer medium introduction port 2 towards both end portions of the heat transfer medium introduction surface of the metal fiber sheet 6, thus forming a heat transfer medium dispersion area 10a having a substantially trapezoidal horizontal cross-section, and has a shape that is continuously angled so as to narrow down from both end portions of the heat transfer medium discharge surface of the metal fiber sheet 6 towards the heat transfer medium discharge port 4, thus forming a heat transfer medium buffer area 11a having a substantially trapezoidal cross-section. In the heat transfer medium dispersion area 10a, the heat transfer medium is guided towards the metal fiber sheet 6, and in the heat transfer medium buffer area 11a, the heat transfer medium flows well, thus allowing the heat transfer medium to be effectively dispersed. For this reason, the temperature-controlled surface can be prevented from being cooled or heated unevenly, thus allowing highly uniform temperature control.

The temperature control unit 1a according to the present embodiment is not limited to the above-mentioned configuration, and may include a mode in which a part of the area between the heat transfer medium introduction port 2 and the metal fiber sheet 6 widens diagonally, or a mode in which a part of the area between the metal fiber sheet 6 and the heat transfer medium discharge port 4 is angled.

As explained above, according to the present embodiment, the temperature-controlled surface can be prevented from being cooled or heated unevenly by more effectively dispersing the heat transfer medium.

Embodiment 3

In the present embodiment, a mode in which uneven cooling or heating on the temperature-controlled surface can be prevented by adjusting the flow rate of the heat transfer medium by the arrangement of the metal fiber sheet, thus allowing highly uniform temperature control, will be described.

Figure 4:
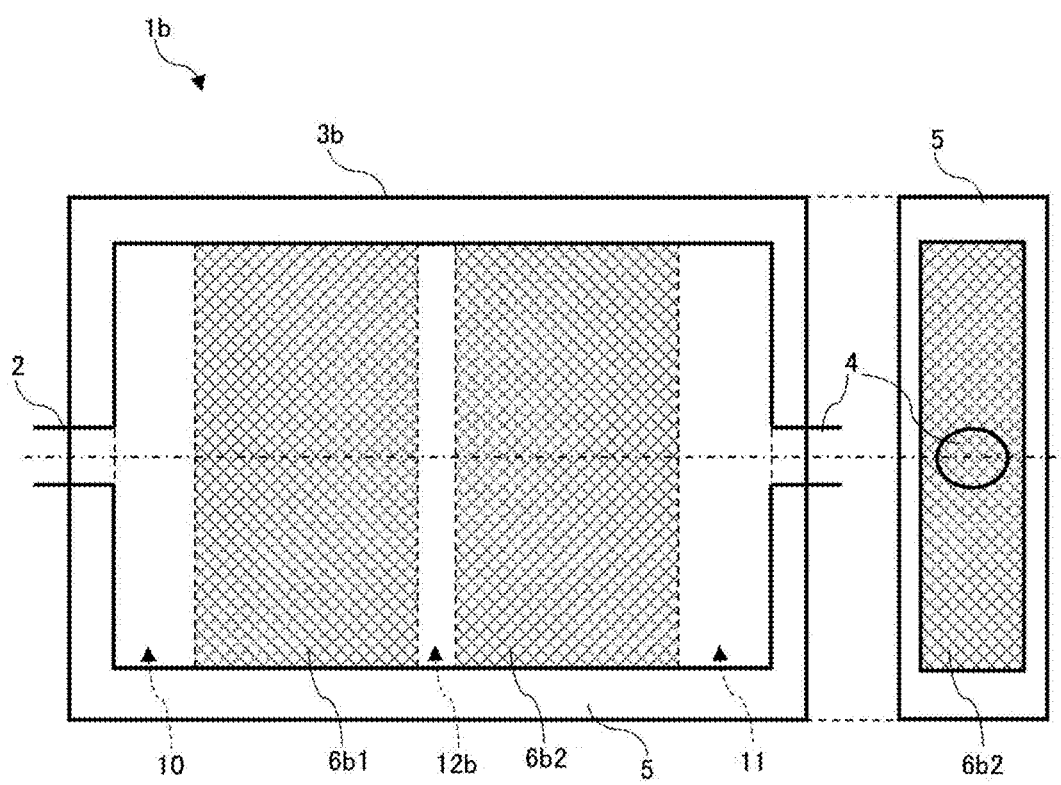
FIG. 4 is a diagram showing a horizontal section view of a temperature control unit according to Embodiment 3 and a side view from a side having a heat transfer medium discharge port.

FIG. 4 is a diagram showing a horizontal section view of a temperature control unit 1b according to the present embodiment and a side view from the side having the heat transfer medium discharge port 4.

The temperature control unit 1b illustrated in FIG. 4 differs from the temperature control unit 1 illustrated in FIG. 2 in that a temperature control mechanism 3b is provided instead of the temperature control mechanism 3.

The temperature control mechanism 3b differs from the temperature control mechanism 3 illustrated in FIG. 2 in being provided with a metal fiber sheet 6b1 and a metal fiber sheet 6b2 instead of the metal fiber sheet 6.

The metal fiber sheet 6b1, which is a first metal fiber sheet, is arranged in the housing 5 on the side towards the heat transfer medium introduction port 2, and the metal fiber sheet 6b2, which is a second metal fiber sheet, is arranged in the housing 5 on the side towards the heat transfer medium discharge port 4. An intermediate area 12b is formed between the metal fiber sheet 6b1 and the metal fiber sheet 6b2.

In the temperature control mechanism 3b, the flow rate of the heat transfer medium can be made uniform by forming the intermediate area 12b, which is a gap, between the metal fiber sheet 6b1 and the metal fiber sheet 6b2.

As explained above, according to the present embodiment, the temperature-controlled surface can be prevented from being cooled or heated unevenly by making the flow rate of the heat transfer medium uniform.

Embodiment 4

In the present embodiment, a mode in which uneven cooling or heating on the temperature-controlled surface can be prevented by making the flow rate of the heat transfer medium uniform by means of the shape of the metal fiber sheet, thus allowing highly uniform temperature control, will be described.

Figure 5:
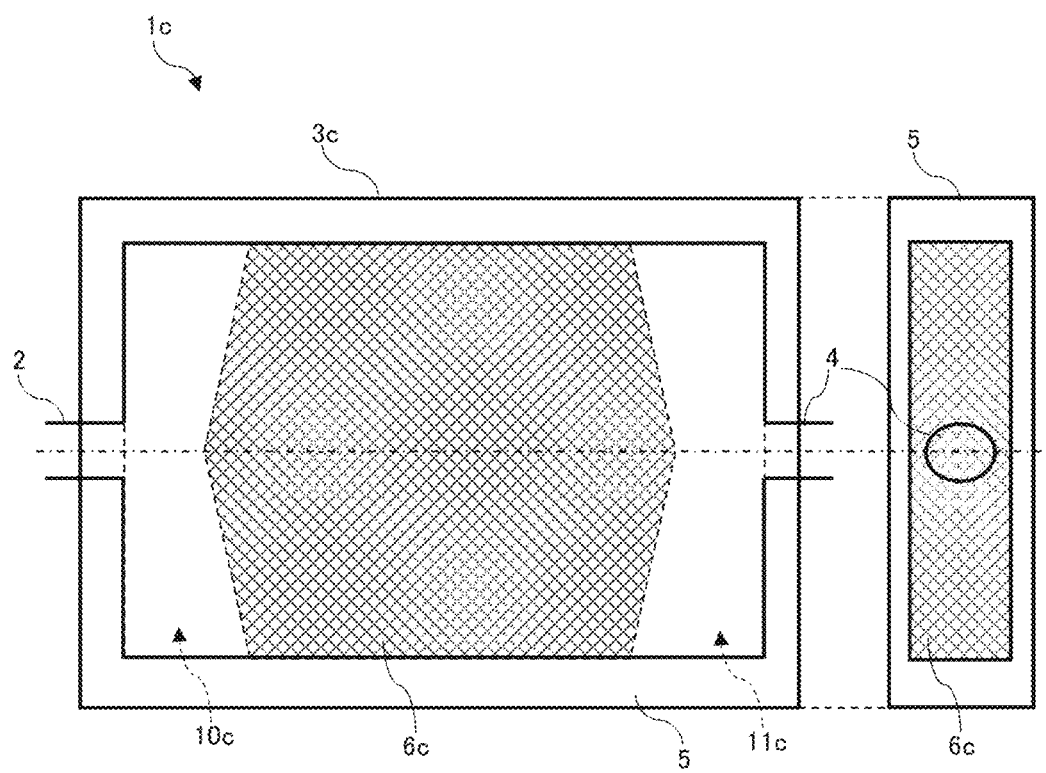
FIG. 5 is a diagram showing a horizontal section view of a temperature control unit according to Embodiment 4 and a side view from a side having a heat transfer medium discharge port.

FIG. 5 is a diagram showing a horizontal section view of a temperature control unit 1c according to the present embodiment and a side view from the side having the heat transfer medium discharge port 4. The temperature control unit 1c illustrated in FIG. 5 differs from the temperature control unit 1 illustrated in FIG. 2 in that a temperature control mechanism 3c is provided instead of the temperature control mechanism 3. The temperature control mechanism 3c differs from the temperature control mechanism 3 illustrated in FIG. 2 in being provided with a metal fiber sheet 6c instead of the metal fiber sheet 6, being provided with a heat transfer medium dispersion area 10c instead of the heat transfer medium dispersion area 10, and being provided with a heat transfer medium buffer area 11c instead of the heat transfer medium buffer area 11.

The metal fiber sheet 6c has a shape that is long in a central portion sandwiched between the heat transfer medium introduction port 2 and the heat transfer medium discharge port 4, and that becomes short at both end portions of the heat transfer medium introduction surface and the heat transfer medium discharge surface. By providing the metal fiber sheet 6c with such a shape, the heat transfer medium introduced from the heat transfer medium introduction port 2 has a long passage distance through the metal fiber sheet 6c in the central portion, and has a short passage distance through the metal fiber sheet 6c at both end portions, thus suppressing the flow rate of the heat transfer medium at the central portion to which the heat transfer medium is introduced in a high flow rate state. For this reason, the difference between the flow rate of the heat transfer medium in the central portion and at both end portions is made small, thus allowing the flow rate of the heat transfer medium to be made uniform.

Although the metal fiber sheet 6c illustrated in FIG. 5 has a shape in which the central portion is longer than both end portions, this is because the heat transfer medium introduction port 2 and the heat transfer medium discharge port 4 are provided in the central portion, thus causing the flow rate of the heat transfer medium to be high in the central portion. The portion that is made longer need not be limited to the central portion as long as the path of the heat transfer medium in the metal fiber sheet is made longer at a portion at which the flow rate of the heat transfer medium that is introduced is higher than that at other portions. For example, if heat transfer medium introduction ports 2 and heat transfer medium discharge ports 4 are provided at both end portions, and the flow rate of the heat transfer medium is higher at both end portions than at the central portion, then the shape is made longer at both end portions than at the central portion.

As explained above, according to the present embodiment, the temperature-controlled surface can be prevented from being cooled or heated unevenly by making the flow rate of the heat transfer medium uniform by means of the shape of the metal fiber sheet.

Embodiment 5

In the present embodiment, a mode in which uneven cooling or heating on the temperature-controlled surface can be prevented by making the flow rate of the heat transfer medium uniform by adjusting the fiber density of the metal fiber sheet, thus allowing highly uniform temperature control, will be described.

Figure 6:
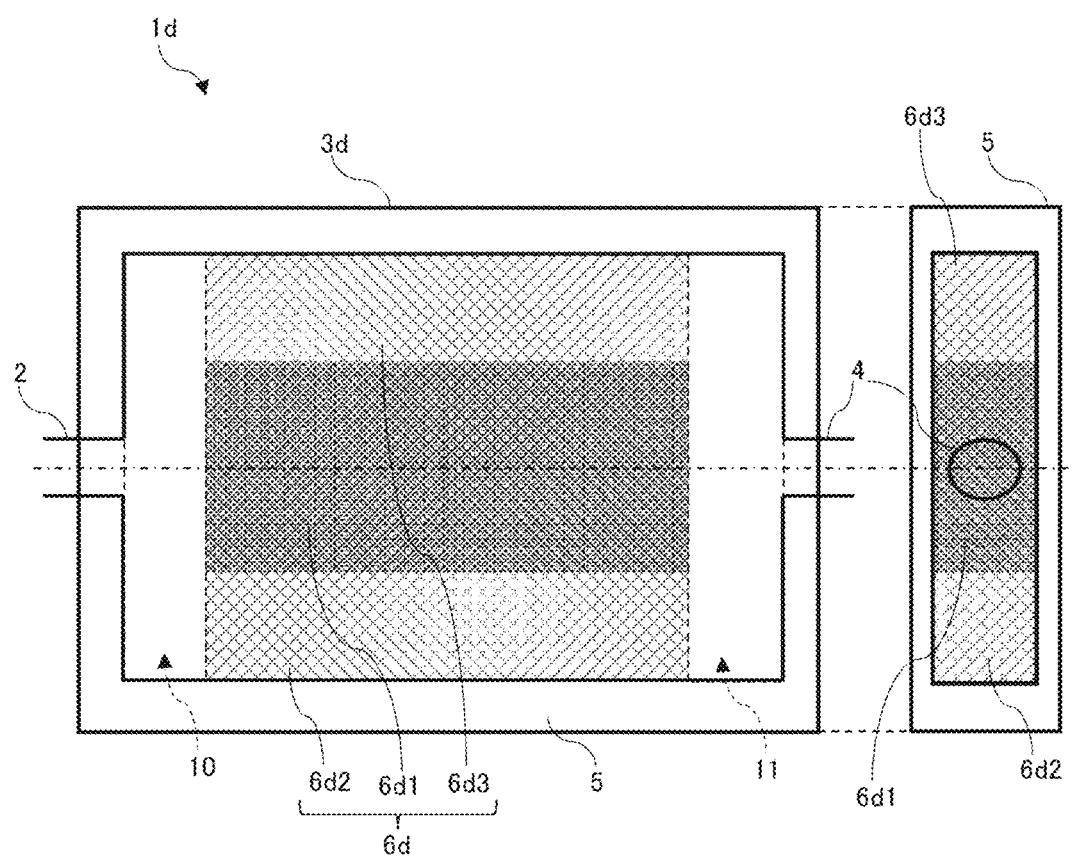
FIG. 6 is a diagram showing a horizontal section view of a temperature control unit according to Embodiment 5 and a side view from a side having a heat transfer medium discharge port.

FIG. 6 is a diagram showing a horizontal section view of a temperature control unit 1d according to the present embodiment and a side view from the side having the heat transfer medium discharge port 4. The temperature control unit 1d illustrated in FIG. 6 differs from the temperature control unit 1 illustrated in FIG. 2 in that a temperature control mechanism 3d is provided instead of the temperature control mechanism 3. The temperature control mechanism 3d differs from the temperature control mechanism 3 illustrated in FIG. 2 in being provided with a metal fiber sheet 6d instead of the metal fiber sheet 6.

The metal fiber sheet 6d is provided with a fiber-concentrated area 6d1, in which the metal fibers are densely arranged, and a fiber-unconcentrated area 6d2 and a fiber-unconcentrated area 6d3, in which the metal fibers are more sparsely arranged than those in the fiber-concentrated area 6d1. The fiber-concentrated area 6d1 is arranged to be in a central portion sandwiched between the heat transfer medium introduction port 2 and the heat transfer medium discharge port 4, and the fiber-unconcentrated area 6d2 and the fiber-unconcentrated area 6d3 are arranged to be at the respective end portions. By configuring the metal fiber sheet 6d in such a manner, the heat transfer medium introduced from the heat transfer medium introduction port 2 passes through the fiber-concentrated area 6d1 in the central portion and passes through the fiber-unconcentrated area 6d2 or the fiber-unconcentrated area 6d3 at both end portions, thus suppressing the flow rate of the heat transfer medium more in the central portion, at which the flow rate is high at the time of introduction, than at both end portions. For this reason, the difference in flow rate is suppressed between the heat transfer medium in the central portion, at which the flow rate of the heat transfer medium is high, and in both end portions, at which the flow rate of the heat transfer medium is low, thus allowing the flow rate of the heat transfer medium to be made uniform.

The metal fiber sheet 6d can be formed by partially stacking and pressing multiple metal fiber sheets. The metal fiber sheet 6d can be formed by pressing a larger number of stacked metal fiber sheets in the fiber-concentrated area 6d1, in which the metal fibers are densely arranged, than in the fiber-unconcentrated area 6d2 and the fiber-unconcentrated area 6d3.

As explained above, according to the present embodiment, the temperature-controlled surface can be prevented from being cooled or heated unevenly by making the flow rate of the heat transfer medium uniform by means of the fiber density of the metal fiber sheet.

Embodiment 6

In the present embodiment, a mode in which uneven cooling or heating on the temperature-controlled surface can be prevented by making the flow rate of the heat transfer medium uniform by removing a portion of the metal fiber sheet to form a flow passage for the heat transfer medium, thus allowing highly uniform temperature control, will be described.

Figure 7:
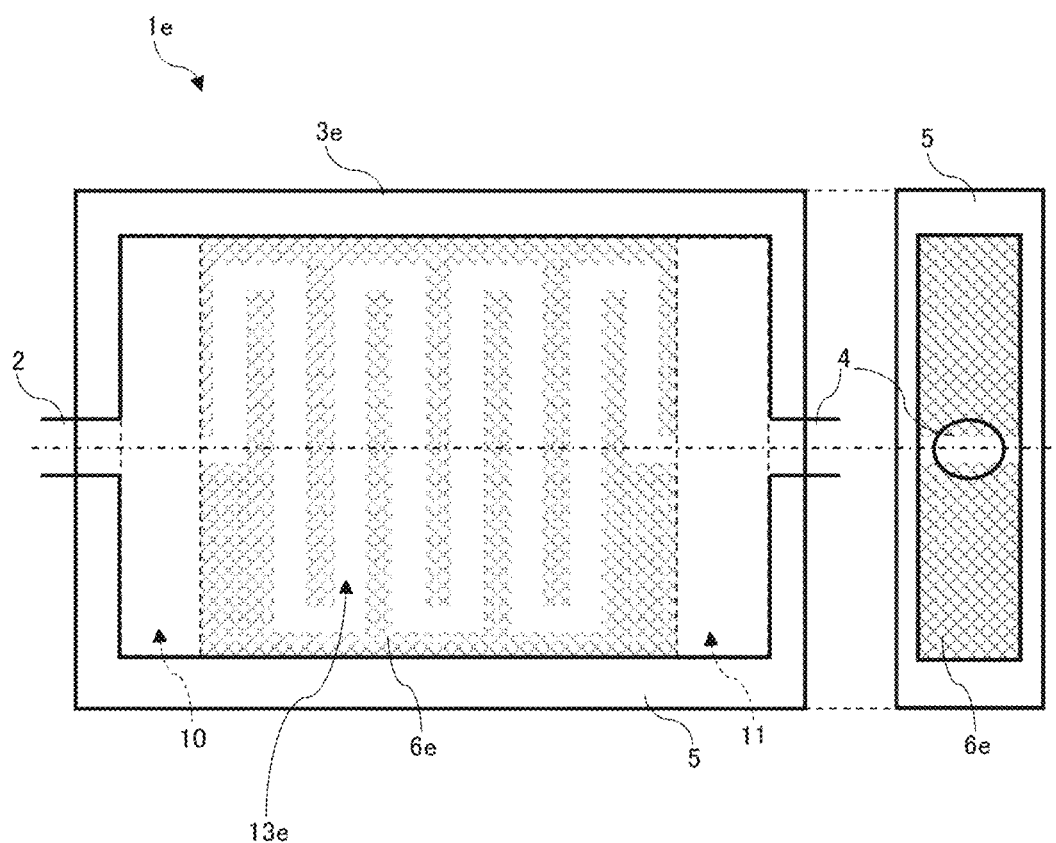
FIG. 7 is a diagram showing a horizontal section view of a temperature control unit according to Embodiment 6 and a side view from a side having a heat transfer medium discharge port.

FIG. 7 is a diagram showing a horizontal section view of a temperature control unit 1e according to the present embodiment and a side view from the side having the heat transfer medium discharge port 4. The temperature control unit 1e illustrated in FIG. 7 differs from the temperature control unit 1 illustrated in FIG. 2 in that a temperature control mechanism 3e is provided instead of the temperature control mechanism 3. The temperature control mechanism 3e differs from the temperature control mechanism 3 illustrated in FIG. 2 in being provided with a metal fiber sheet 6e instead of the metal fiber sheet 6.

The metal fiber sheet 6e is provided with a heat transfer medium flow passage 13e formed by continuously removing a portion of the metal fiber sheet 6. The heat transfer medium flow passage 13e is formed from flow passages in a direction from the heat transfer medium introduction port 2 to the heat transfer medium discharge port 4, and flow passages in a direction perpendicular thereto. The metal fiber sheet 6e having such a configuration also suppresses differences between the flow rate in the central portion and at both end portions, thus allowing the flow rate of the heat transfer medium to be made uniform. The heat transfer medium flow passage 13e has a meandering shape due to the metal fiber sheet 6e, a portion of which is removed.

As explained above, according to the present embodiment, the temperature-controlled surface can be prevented from being cooled or heated unevenly by making the flow rate of the heat transfer medium uniform by removing a portion of the metal fiber sheet to form a meandering heat transfer medium flow passage.

Embodiment 7

In the present embodiment, a mode in which uneven cooling or heating on the temperature-controlled surface can be prevented by making the flow rate of the heat transfer medium uniform by means of the shape of the housing of the temperature control mechanism, thus allowing highly uniform temperature control, will be described.

Figure 8:
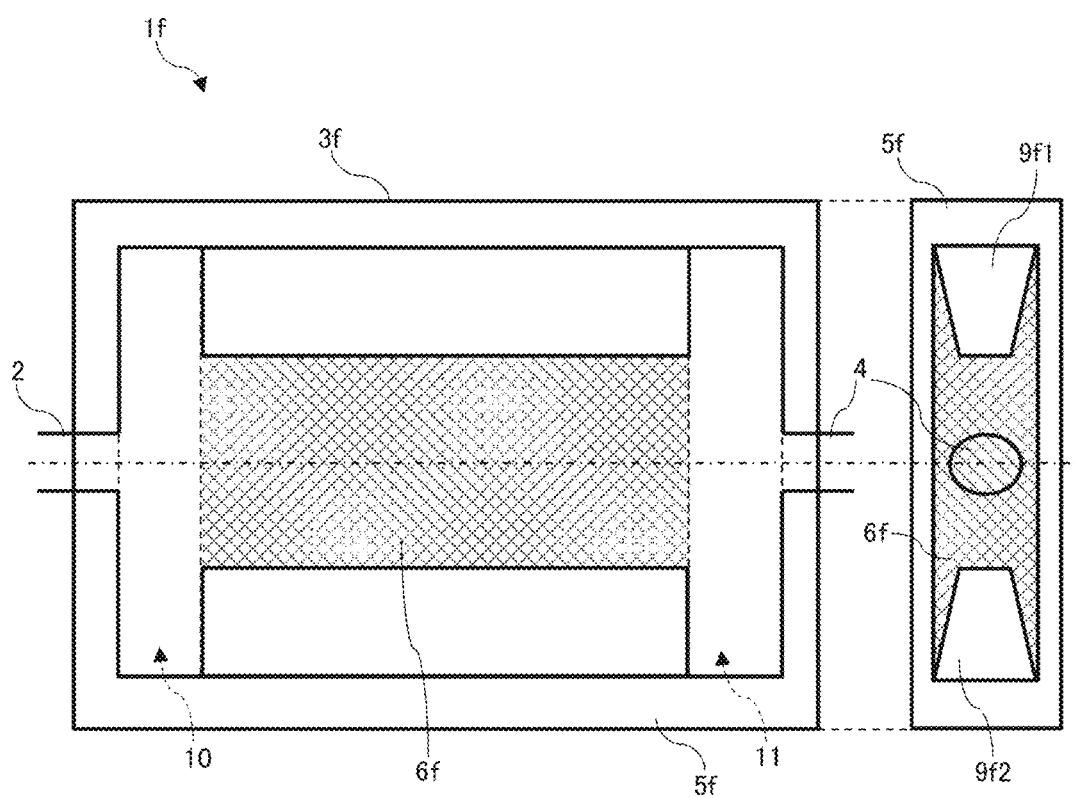
FIG. 8 is a diagram showing a horizontal section view of a temperature control unit according to Embodiment 7 and a side view from a side having a heat transfer medium discharge port.

FIG. 8 is a diagram showing a horizontal section view of a temperature control unit 1f according to the present embodiment and a side view from the side having the heat transfer medium discharge port 4. The temperature control unit 1f illustrated in FIG. 8 differs from the temperature control unit 1 illustrated in FIG. 2 in that a temperature control mechanism 3f is provided instead of the temperature control mechanism 3. The temperature control mechanism 3f differs from the temperature control mechanism 3 illustrated in FIG. 2 in being provided with a housing 5f instead of the housing 5, and being provided with a metal fiber sheet 6f instead of the metal fiber sheet 6. The housing 5f has a structure 9f1 and a structure 9f2 added to the housing 5.

In the housing 5f, the structure 9f1 and the structure 9f2 are provided, respectively, on both end portions of the heat transfer medium introduction surface and the heat transfer medium discharge surface, and make the flow rate of the heat transfer medium higher by narrowing the flow passage of the heat transfer medium at both end portions. The housing 5f having such a configuration also suppresses differences between the flow rate in the central portion and at both end portions, thus allowing the flow rate of the heat transfer medium to be made uniform. Additionally, the temperature control mechanism 3f illustrated in FIG. 8 is better at suppressing pressure loss of the heat transfer medium than the temperature control mechanism 3d illustrated in FIG. 6 is.

As explained above, according to the present embodiment, the temperature-controlled surface can be prevented from being cooled or heated unevenly by making the flow rate of the heat transfer medium uniform by arranging structures at both sides of the housing.

Embodiment 8

In the present embodiment, a mode in which uneven cooling or heating on the temperature-controlled surface can be prevented by making the flow rate of the heat transfer medium uniform by providing the housing of the temperature control mechanism with structures different from those in Embodiment 7, thus allowing highly uniform temperature control, will be described.

Figure 9:
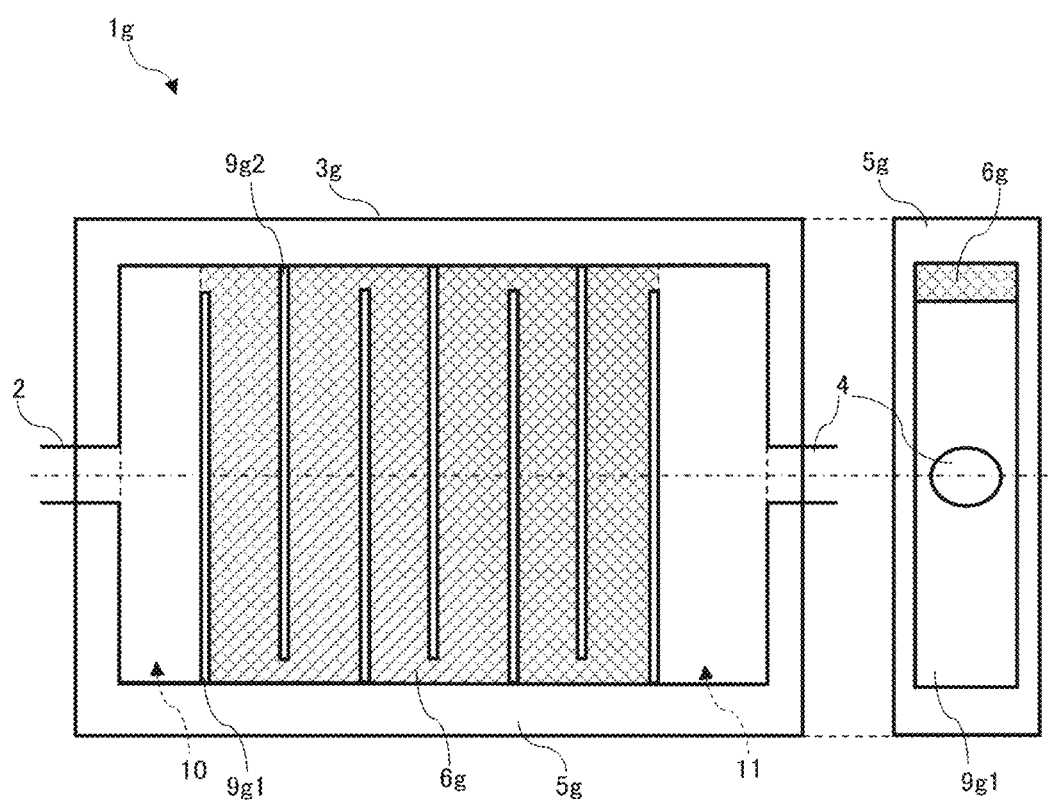
FIG. 9 is a diagram showing a horizontal section view of a temperature control unit according to Embodiment 8 and a side view from a side having a heat transfer medium discharge port.

FIG. 9 is a diagram showing a horizontal section view of a temperature control unit 1g according to the present embodiment and a side view from the side having the heat transfer medium discharge port 4. The temperature control unit 1g illustrated in FIG. 9 differs from the temperature control unit 1 illustrated in FIG. 2 in that a temperature control mechanism 3g is provided instead of the temperature control mechanism 3. The temperature control mechanism 3g differs from the temperature control mechanism 3 illustrated in FIG. 2 in being provided with a housing 5g instead of the housing 5, and being provided with a metal fiber sheet 6g instead of the metal fiber sheet 6. The housing 5g has structures 9g1 and structures 9g2 added to the housing 5. In the housing 5g, a meandering flow passage is formed by the structures 9g1 and the structures 9g2, which block parts of the heat transfer medium flow passage.

In the housing 5g illustrated in FIG. 9, multiple structures 9g1 and structures 9g2 are provided on either of the end portions of the heat transfer medium introduction surface and the heat transfer medium discharge surface. The multiple structures 9g1 are provided so as to be in contact with either one of the end portions of the heat transfer medium introduction surface and the heat transfer medium discharge surface, and the multiple structures 9g2 are provided so as to be in contact with the other of the end portions of the heat transfer medium introduction surface and the heat transfer medium discharge surface. In other words, the multiple structures 9g1 and the multiple structures 9g2 are provided on surfaces that face each other in the housing 5g. The structures 9g1 and the structures 9g2 are arranged in alternating fashion. The housing 5g having such a configuration also suppresses differences between the flow rate in the central portion and at both end portions, thus allowing the flow rate of the heat transfer medium to be made uniform.

The metal fiber sheet 6g can be formed by hollowing out a portion of the metal fiber sheet 6. The metal fiber sheet 6 can be hollowed out by using a hollowing mold, or by laser ablation. Furthermore, the mechanical strength of the metal fiber sheet 6g is preferably improved by sintering the housing 5g in which the metal fiber sheet 6g has been fitted, then adhering the metal fiber sheet 6g to the multiple structures 9g1 and structures 9g2 with epoxy or the like to fill the gaps therebetween.

As explained above, according to the present embodiment, the temperature-controlled surface can be prevented from being cooled or heated unevenly by making the flow rate of the heat transfer medium uniform by arranging structures in alternating fashion on both sides of the housing to form the heat transfer medium flow passage.

Embodiment 9

In Embodiments 1 to 8 described above, modes mainly characterized by the horizontal cross-section and the side surfaces of the temperature control unit were explained. However, the present invention is not limited thereto.

FIG. 10(A) to 10(E) are diagrams illustrating, as temperature control units according to the present embodiment, first to fifth modified examples of cross-sections at A-A on the top surface of the temperature control unit illustrated in FIG. 1. Additionally, in the present embodiment, a sealing member (not illustrated) is provided between the housing and the heat exchange plate configured to provide a seal therebetween.

A temperature control unit 1h, which is the first modified example illustrated in FIG. 10(A), has a heat transfer medium introduction port 2h, a temperature control mechanism 3h, and a heat transfer medium discharge port 4h. The temperature control mechanism 3h is provided with a metal fiber sheet 6, a housing 5h configured to house the metal fiber sheet 6, and a heat exchange plate 7 provided so that one main surface is exposed to the outer side of the temperature control mechanism 3h and the rear surface of the one main surface contacts the metal fiber sheet 6, thereby exchanging heat between the metal fiber sheet 6 and outside. The heat transfer medium introduced from the heat transfer medium introduction port 2h passes through the temperature control mechanism 3h and is discharged from the heat transfer medium discharge port 4h.

In the temperature control unit 1h illustrated in FIG. 10(A), the heat transfer medium introduction port 2h and the heat transfer medium discharge port 4h are expanded towards the heat exchange plate 7 in comparison with the temperature control unit 1 illustrated in FIG. 1. Thus, the flow of the heat transfer medium is not hindered at the time of introduction and at the time of discharge. Furthermore, the cross-sectional areas of the dispersion area and the buffer area are made larger. Additionally, the housing 5h differs from the housing 5 by having a shape in which the heat transfer medium introduction port 2h and the heat transfer medium discharge port 4h can be mounted. By having such a configuration, the heat transfer medium can be dispersed over a wider area than in the temperature control unit 1 illustrated in FIG. 1, thereby improving the uniformity of the temperature of the heat transfer medium and allowing more highly uniform temperature control.

A temperature control unit 1i, which is the second modified example illustrated in FIG. 10(B), has a heat transfer medium introduction port 2i, a temperature control mechanism 3i, and a heat transfer medium discharge port 4i. The temperature control mechanism 3i is provided with a metal fiber sheet 6, a housing 5i configured to house the metal fiber sheet 6, and a heat exchange plate 7 provided so that one main surface is exposed to the outer side of the temperature control mechanism 3i and the rear surface of the one main surface contacts the metal fiber sheet 6, thereby exchanging heat between the metal fiber sheet 6 and outside. The heat transfer medium introduced from the heat transfer medium introduction port 2i passes through the temperature control mechanism 3i and is discharged from the heat transfer medium discharge port 4i.

In the temperature control unit 1i illustrated in FIG. 10(B), the flow of the heat transfer medium is not hindered from the heat transfer medium introduction port 2i to the metal fiber sheet 6, and from the metal fiber sheet 6 to the heat transfer medium discharge port 4i. Additionally, the housing 5i differs from the housing 5 by having a shape in which the flow of the heat transfer medium is not hindered from the heat transfer medium introduction port 2i to the metal fiber sheet 6, and from the metal fiber sheet 6 to the heat transfer medium discharge port 4i. By having such a configuration, pressure loss of the heat transfer medium can be better suppressed than in the temperature control unit 1 illustrated in FIG. 1.

A temperature control unit 1j, which is the third modified example illustrated in FIG. 10(C), has a heat transfer medium introduction port 2j, a temperature control mechanism 3j, and a heat transfer medium discharge port 4j. The temperature control mechanism 3j is provided with a metal fiber sheet 6, a housing 5j configured to house the metal fiber sheet 6, and a heat exchange plate 7j provided so that one main surface is exposed to the outer side of the temperature control mechanism 3j and the rear surface of the one main surface contacts the metal fiber sheet 6, thereby exchanging heat between the metal fiber sheet 6 and outside. The heat transfer medium introduced from the heat transfer medium introduction port 2j passes through the temperature control mechanism 3j and is discharged from the heat transfer medium discharge port 4j.

In the temperature control unit 1j illustrated in FIG. 10(C), the flow of the heat transfer medium is narrowed in a stepwise manner from the heat transfer medium introduction port 2j to the metal fiber sheet 6, and from the metal fiber sheet 6 to the heat transfer medium discharge port 4j. The housing 5j has a shape similar to that of the housing 5h illustrated in FIG. 10(A). Additionally, the heat exchange plate 7j differs from the heat exchange plate 7 by having a shape in which the heat transfer medium flow passage is narrowed in a stepwise manner. By having such a configuration, the introduction of the heat transfer medium into the flow passage can be made more uniform than in the temperature control unit 1 illustrated in FIG. 1.

A temperature control unit 1k, which is the fourth modified example illustrated in FIG. 10(D), has a heat transfer medium introduction port 2k, a temperature control mechanism 3k, and a heat transfer medium discharge port 4k. The temperature control mechanism 3k is provided with a metal fiber sheet 6k, a housing 5k configured to house the metal fiber sheet 6k, and a heat exchange plate 7 provided so that one main surface is exposed to the outer side of the temperature control mechanism 3k and the rear surface of the one main surface contacts the metal fiber sheet 6k, thereby exchanging heat between the metal fiber sheet 6k and outside. The heat transfer medium introduced from the heat transfer medium introduction port 2k passes through the temperature control mechanism 3k and is discharged from the heat transfer medium discharge port 4k.

In the temperature control unit 1k illustrated in FIG. 10(D), the heat transfer medium introduced from the heat transfer medium introduction port 2k is quickly dispersed in the dispersion area. The metal fiber sheet 6k is formed to be thicker than the metal fiber sheet 6. Additionally, the housing 5k differs from the housing 5 by having a shape in which the heat transfer medium introduction port 2k and the heat transfer medium discharge port 4k can be mounted, and in which the metal fiber sheet 6k can be housed. By having such a configuration, the heat transfer medium can be more quickly dispersed in the dispersion area than in the temperature control unit 1 illustrated in FIG. 1.

A temperature control unit 1l, which is the fifth modified example illustrated in FIG. 10(E), has a heat transfer medium introduction port 2l, a temperature control mechanism 3l, and a heat transfer medium discharge port 4l. The temperature control mechanism 3l is provided with a metal fiber sheet 6, a housing 5l configured to house the metal fiber sheet 6, and a heat exchange plate 7l provided so that one main surface is exposed to the outer side of the temperature control mechanism 3l and the rear surface of the one main surface contacts the metal fiber sheet 6, thereby exchanging heat between the metal fiber sheet 6 and outside. The heat transfer medium introduced from the heat transfer medium introduction port 2l passes through the temperature control mechanism 3l and is discharged from the heat transfer medium discharge port 4l.

In the temperature control unit 1l illustrated in FIG. 10(E), the flow of the heat transfer medium is narrowed in a stepwise manner from the heat transfer medium introduction port 2l to the metal fiber sheet 6, and from the metal fiber sheet 6 to the heat transfer medium discharge port 4l. The housing 5l differs from the housing 5k by having a shape in which the flow of the heat transfer medium is narrowed in a stepwise manner. Additionally, the heat exchange plate 7l has a shape in which the flow passage of the heat transfer medium is narrowed in a stepwise manner, and has a cross-sectional shape similar to that of the heat exchange plate 7j. By having such a configuration, the heat transfer medium can be more quickly dispersed in the dispersion area and the introduction of the heat transfer medium into the flow passage can be made more uniform than in the temperature control unit 1 illustrated in FIG. 1.

Figure 10:
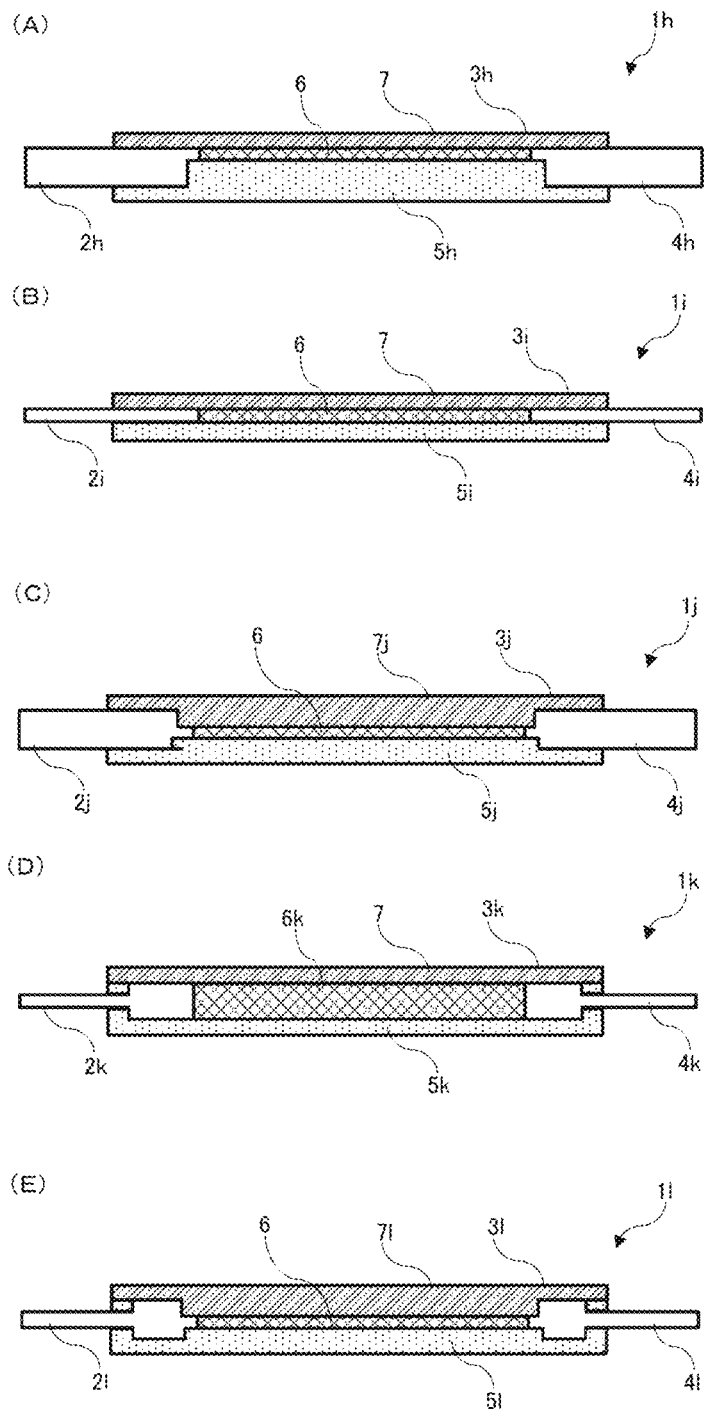
FIG. 10 is a diagram showing, as temperature control units according to Embodiment 9, first to fifth modified examples of the section view along A-A in the top view shown in FIG. 1.

As described with reference to FIG. 10 above, various cross-sectional shapes may be employed for the temperature control unit according to the present invention. Additionally, with the above-mentioned configurations, the heat transfer medium introduction port and the heat transfer medium discharge port are installed in the temperature control mechanism from a horizontal direction. However, the present invention is not limited thereto.

FIGS. 11(A) and 11(B) are diagrams illustrating, as temperature control units according to the present embodiment, configurations in which the heat transfer medium introduction port and the heat transfer medium discharge port are installed in the temperature control unit from a vertical direction.

A temperature control unit 1*m* illustrated in FIG. 11(A) has a heat transfer medium introduction port 2*m*, a temperature control mechanism 3*m*, and a heat transfer medium discharge port 4*m*. The temperature control mechanism 3*m* is provided with a metal fiber sheet 6, a housing 5*m* configured to house the metal fiber sheet 6, and a heat exchange plate 7*m* provided so that one main surface is exposed to the outer side of the temperature control mechanism 3*m* and the rear surface of the one main surface contacts the metal fiber sheet 6, thereby exchanging heat between the metal fiber sheet 6 and outside. The heat transfer medium introduced from the heat transfer medium introduction port 2*m* passes through the temperature control mechanism 3*m* and is discharged from the heat transfer medium discharge port 4*m*.

In the temperature control unit 1*m* illustrated in FIG. 11(A), the heat transfer medium introduction port 2*m* and the heat transfer medium discharge port 4*m*, which penetrate through the heat exchange plate 7*m*, are installed in the temperature control mechanism 3*m* from a vertical direction. The housing 5*m* differs from the housing 5 in that openings are not provided in the side surfaces. Additionally, the heat exchange plate 7*m* differs from the heat exchange plate 7 in that openings are provided configured to arrange the heat transfer medium introduction port 2*m* and the heat transfer medium discharge port 4*m*.

A temperature control unit 1*n* illustrated in FIG. 11(B) has a heat transfer medium introduction port 2*n*, a temperature control mechanism 3*n*, and a heat transfer medium discharge port 4*n*. The temperature control mechanism 3*n* is provided with a metal fiber sheet 6, a housing 5*n* configured to house the metal fiber sheet 6, and a heat exchange plate 7 provided so that one main surface is exposed to the outer side of the temperature control mechanism 3*n* and the rear surface of the one main surface contacts the metal fiber sheet 6, thereby exchanging heat between the metal fiber sheet 6 and outside. The heat transfer medium introduced from the heat transfer medium introduction port 2*n* passes through the temperature control mechanism 3*n* and is discharged from the heat transfer medium discharge port 4*n*.

In the temperature control unit 1*n* illustrated in FIG. 11(B), the heat transfer medium introduction port 2*n* and the heat transfer medium discharge port 4*n* are installed in the temperature control mechanism 3*n* from a vertical direction by penetrating through the bottom surface of the housing 5*n*. The housing 5*n* differs from the housing 5 in that openings are provided in the bottom surface rather than in the side surfaces.

Figure 11:
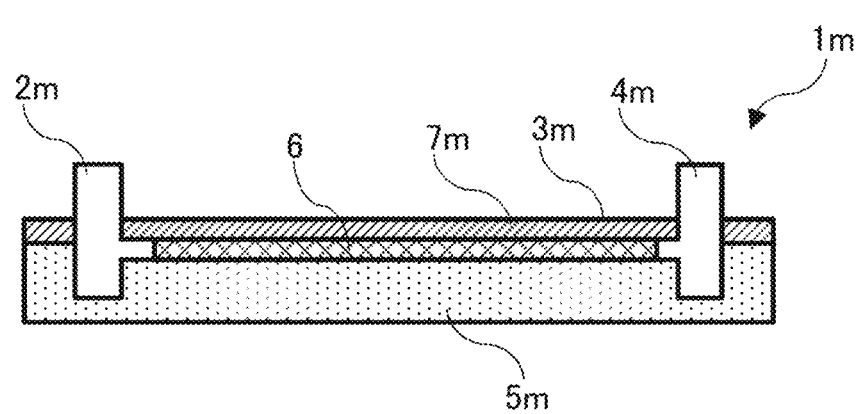
FIG. 11 is a diagram showing, as temperature control units according to Embodiment 9, configurations in which a heat transfer medium introduction port and a heat transfer medium discharge port are installed in a temperature control mechanism from a vertical direction.
Figure 11:
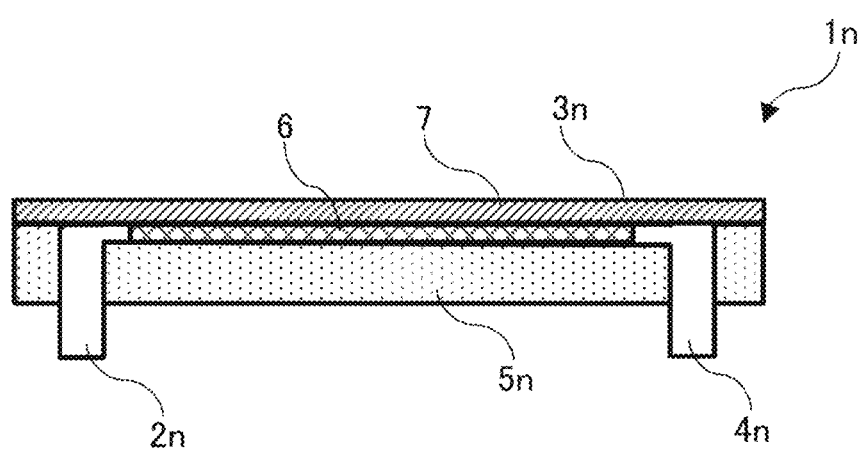

As described with reference to FIG. 11 above, in the temperature control unit according to the present invention, the heat transfer medium may be introduced from a vertical direction. Additionally, FIG. 11(A) illustrates a configuration in which the heat transfer medium is introduced to the temperature control mechanism from above and is discharged upward. FIG. 11(B) illustrates a configuration in which the heat transfer medium is introduced to the temperature control mechanism from below and is discharged downward. However, the present invention is not limited thereto, and may be configured so that the heat transfer medium is introduced to the temperature control mechanism from above and discharged downward, or configured so that the heat transfer medium is introduced from below and discharged upward.

Although the temperature control units according to Embodiments 1 to 9 above are provided with metal fiber sheets, as an alternative thereto, a porous metal may be provided. Metal fiber sheets and porous metals will be referred to collectively as porous metal bodies. Additionally, metal fiber sheets include metal fiber nonwoven fabrics, metal fiber woven fabrics, and metal meshes.

In the temperature control units according to Embodiments 1 to 9 above, the heat exchange plates include temperature-controlled surfaces. However, the present invention is not limited thereto. A plate-shaped portion that does not perform heat exchange may be provided instead of the heat exchange plate, and the temperature-controlled surface may be included on the housing side. Alternatively, the heat exchange plate may include a temperature-controlled surface and the housing may include a temperature-controlled surface, in which case temperature-controlled surfaces are formed on both surfaces of the temperature control unit. Alternatively, the temperature control unit of the present invention does not need to be provided with a plate-shaped member. In the case in which a plate-shaped member is not provided, if one or more main surfaces of the housing are exposed to the outer side of the temperature control mechanism and the inner surfaces of those main surfaces contact the metal porous body, then the portions of the housing including those main surfaces function so as to exchange heat between the porous metal body and outside.

Additionally, configurations combining each of the above-mentioned embodiments are also included in the present invention. For example, the configuration of Embodiment 2 and the configuration of Embodiment 3 may be combined, the configuration of Embodiment 2 and the configuration of Embodiment 4 may be combined, and the configuration of Embodiment 2, the configuration of Embodiment 3, and the configuration of Embodiment 4 may be combined. In particular, Embodiment 9 can be favorably combined with the configurations of the other embodiments.

REFERENCE SIGNS LIST 1, 1*a*, 1*b*, 1*c*, 1 *d*, 1*e*, 1*f*, 1*g*, 1*h*, 1*i*, 1*j*, 1*k*, 1*l*, 1*m*, 1*n* Temperature control unit
2, 2*h*, 2*i*, 2*j*, 2*k*, 2*l*, 2*m*, 2*n* Heat transfer medium introduction port
3, 3*a*, 3*b*, 3*c*, 3*d*, 3*e*, 3*f*, 3*g*, 3*h*, 3*i*, 3*j*, 3*k*, 3*l*, 3*m*, 3*n* Temperature control mechanism
4, 4*h*, 4*i*, 4*j*, 4*k*, 4*l*, 4*m*, 4*n* Heat transfer medium discharge port
5, 5*a*, 5*f*, 5*g*, 5*h*, 5*i*, 5*j*, 5*k*, 5*l*, 5*m*, 5*n* Housing
6, 6*b*1, 6*b*2, 6*c*, 6*d*, 6*e*, 6*f*, 6*g*, 6*k* Metal fiber sheet
6*d*1 Fiber-concentrated area
6*d*2, 6*d*3 Fiber-unconcentrated area
7, 7*j*, 7*l*, 7*m* Heat exchange plate
8 Sealing member
9, 9*f*1, 9*f*2, 9*g*1, 9*g*2 Structure
10, 10*a*, 10*c* Dispersion area
11, 11*a*, 11*c* Buffer area
12*b* Intermediate area
13*e* Heat transfer medium flow passage

The invention claimed is:

1. A temperature control unit comprising:
a heat transfer medium introduction port configured to introduce a heat transfer medium from outside;
a temperature control mechanism through which the heat transfer medium from the heat transfer medium introduction port passes; and
a heat transfer medium discharge port configured to discharge the heat transfer medium from the temperature control mechanism to outside, wherein:
the temperature control mechanism comprises
a porous metal body; and
a housing configured to house the porous metal body;
at least one main surface of the housing is exposed to an outer side of the temperature control mechanism, and an inner side of the main surface contacts the porous metal body, thereby exchanging heat between the porous metal body and outside; and
a heat transfer medium dispersion area is provided between the heat transfer medium introduction port and the porous metal body;
characterized in that
the housing is configured such that structures are provided in a portion of the housing at which a flow rate of the heat transfer medium becomes lower; and
the structures make the flow rate of the heat transfer medium higher by narrowing a flow passage of the heat transfer medium.

2. The temperature control unit according to claim 1, wherein a heat transfer medium buffer area is provided between the porous metal body and the heat transfer medium discharge port.

3. The temperature control unit according to claim 1, wherein the porous metal body is a metal fiber sheet configured to include metal fibers.

4. The temperature control unit according to claim 3, wherein:
the heat transfer medium dispersion area has a shape that is continuously angled so as to widen out from the heat transfer medium introduction port towards both end portions of a heat transfer medium introduction surface of the porous metal body; and
the heat transfer medium buffer area has a shape that is continuously angled so as to narrow down from both end portions of a heat transfer medium discharge surface of the metal fiber sheet towards the heat transfer medium discharge port.

5. The temperature control unit according to claim 3, wherein:
the metal fiber sheet comprises:
a first metal fiber sheet arranged on the heat transfer medium introduction port side; and
a second metal fiber sheet arranged on the heat transfer medium discharge port side, and
a gap is formed between the first metal fiber sheet and the second metal fiber sheet.

6. The temperature control unit according to claim 3, wherein the metal fiber sheet has a shape such that a passage for the heat transfer medium becomes longer in a portion at which the flow rate of the heat transfer medium becomes higher.

7. The temperature control unit according to claim 3, wherein the metal fiber sheet is configured such that the metal fibers are densely arranged in a portion at which the flow rate of the heat transfer medium becomes higher.

8. The temperature control unit according to claim 3, wherein part of the metal fiber sheet is removed to form a flow passage with a meandering shape.

9. The temperature control unit according to claim 1, wherein the housing is configured such that a structure blocks part of a flow passage for the heat transfer medium, thereby forming a meandering flow passage.

* * * * *